United States Patent
Ayranci et al.

(10) Patent No.: US 10,938,349 B1
(45) Date of Patent: Mar. 2, 2021

(54) TURN ON TIME ACCELERATION OF A CASCODE AMPLIFIER

(71) Applicant: pSemi Corporation, San Diego, CA (US)

(72) Inventors: Emre Ayranci, San Diego, CA (US); Niraja Shreekant Paranjape, La Jolla, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 16/692,750

(22) Filed: Nov. 22, 2019

(51) Int. Cl.
 *H03F 1/02* (2006.01)
 *H03F 3/193* (2006.01)
 *H04B 1/04* (2006.01)
 *H04B 1/16* (2006.01)

(52) U.S. Cl.
 CPC ........... *H03F 1/0205* (2013.01); *H03F 3/193* (2013.01); *H03F 2200/294* (2013.01); *H03F 2200/451* (2013.01); *H04B 1/04* (2013.01); *H04B 1/16* (2013.01)

(58) Field of Classification Search
 CPC ........................................................ H03F 1/02
 See application file for complete search history.

(56) References Cited

U.S. PATENT DOCUMENTS

| | | | |
|---|---|---|---|
| 6,313,819 B1* | 11/2001 | Maekawa | G09G 3/2011 345/92 |
| 10,038,418 B1 | 7/2018 | Ayranci et al. | |
| 10,545,523 B1* | 1/2020 | Wu | G05F 1/595 |
| 10,707,823 B1* | 7/2020 | Seshita | H03F 1/0277 |
| 2005/0212603 A1* | 9/2005 | Aoki | H03K 17/04126 330/311 |
| 2006/0119435 A1* | 6/2006 | Oh | H03F 3/72 330/311 |
| 2014/0184334 A1* | 7/2014 | Nobbe | H03F 3/21 330/291 |
| 2014/0266458 A1* | 9/2014 | Scott | H01F 27/385 330/291 |
| 2020/0036341 A1* | 1/2020 | Klaren | H03F 1/0266 |

* cited by examiner

*Primary Examiner* — Patricia T Nguyen
(74) *Attorney, Agent, or Firm* — Steinfl + Bruno LLP

(57) ABSTRACT

Various methods and circuital arrangements for reducing a turn ON time of a cascode amplifier are presented. According to one aspect, a configurable switching arrangement coupled to a cascode transistor of the amplifier shorts a gate of the cascode transistor to a reference ground during an inactive mode of operation of the amplifier. During an active mode of operation of the amplifier, the configurable switching arrangement couples a gate capacitor to the gate of the cascode transistor that is pre-charged to a voltage that is higher than a gate biasing voltage to the cascode transistor, which ensures that cascode transistor turns ON much quicker than the traditional method of grounding the cap, hence provide a final current flow through the cascode amplifier in a shorter time by not limiting the turn ON time of the input transistor. The gate biasing voltage is coupled to the gate capacitor via a resistor. A relationship between the pre-charged voltage, and minimum saturation voltages and threshold voltages of the transistors of the cascode amplifier is also provided.

17 Claims, 8 Drawing Sheets

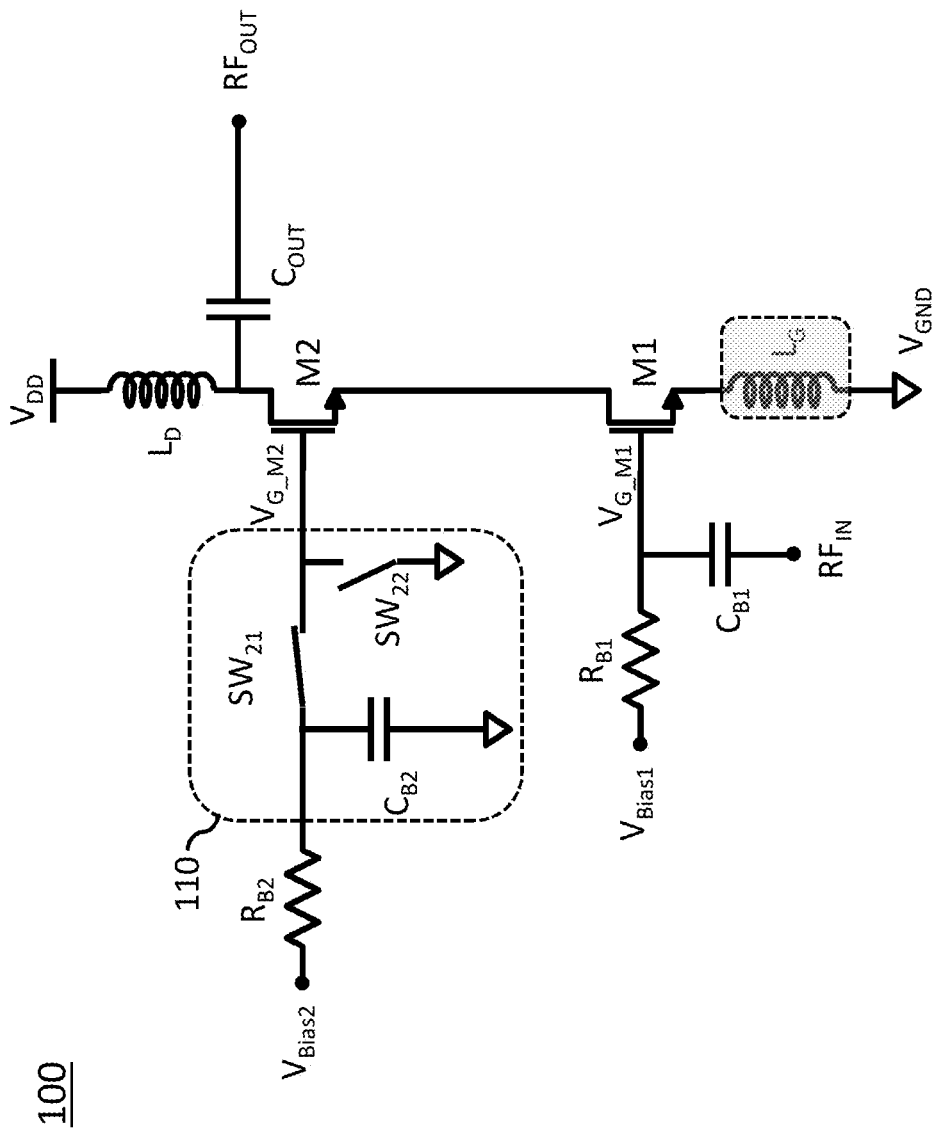
FIG. 1A  *PRIOR ART*

US 10,938,349 B1

TURN ON TIME ACCELERATION OF A CASCODE AMPLIFIER

CROSS REFERENCE TO RELATED APPLICATIONS

The present application may be related to U.S. Pat. No. 10,038,418 B1 entitled "Optimized Multi Gain LNA Enabling Low Current and High Linearity Including Highly Linear Active Bypass" issued Jul. 31, 2018, the disclosure of which is incorporated herein by reference in its entirety.

TECHNICAL FIELD

The present application relates to amplifiers. In particular, the present application relates to turn on time of cascode amplifiers.

BACKGROUND

In recent years, stacked cascode amplifiers, which use a plurality of transistors arranged as a stack (stacked transistors) in an amplification stage of the amplifiers, have become predominant in radio frequency (RF) applications, such as, for example, as power amplifiers (PAs) in transmitter sections of RF front-end communication systems, or as low noise amplifiers (LNAs) in receiver sections of RF front-end communication systems. Due to the higher number of transistors in the stack, voltage handling performance of the amplifier is increased, thereby allowing the higher power and higher voltage outputs. Since the stacked transistors comprise individual low voltage transistors which can tolerate a voltage substantially lower than the output voltage of the amplifier, it is important to bias the low voltage transistors of the stack to maintain operation within their tolerable voltage ranges. In cases where the amplifier can operate according to different modes of operation, such as for example an active (amplification, ON, activated) mode and an inactive (no amplification, OFF, deactivated) mode such voltage compliance of the low voltage transistors of the stack must be maintained during each of the modes of operation.

FIG. 1A shows a prior art configuration of a stacked cascode amplifier (100) comprising an input transistor M1 for receiving an input RF signal, $RF_{IN}$, in series connection with a cascode output transistor M2 for outputting an amplified version, $RF_{OUT}$, of the input RF signal. Bypass capacitors ($C_{B1}$, $C_{OUT}$) can be used to decouple low frequency (e.g., DC) biasing voltages provided to the stack of transistors (transistor stack) from the $RF_{IN}$ and $RF_{OUT}$ signals. It should be noted that, as it is well understood by a person skilled in the art, depending on a respective capacitance value chosen, the capacitors ($C_{B1}$, $C_{OUT}$) may also be part of respective matching networks coupled to the input and output of the stacked cascode amplifier (100). A supply voltage $V_{DD}$ is coupled to the drain of the output transistor M2 through an inductor $L_D$, and a reference ground $V_{GND}$ (e.g., GND or AC ground) is coupled to a source of the input transistor M1 through an optional inductor $L_G$ (e.g., degeneration inductor). It should be noted that although the amplifier (100) is shown with two stacked transistors, higher number of stacked transistors is also possible, wherein a number n of stacked transistors may be any integer number larger than or equal to two, and may be a function of a level of the supply voltage, $V_{DD}$, and tolerable voltage (e.g., handling voltage) ranges of the transistors (M1, M2, . . . , Mn).

In the prior art amplifier (100) of FIG. 1A, biasing of the transistors M1 and M2 may be provided via respective biasing voltages Vbias1 and Vbias2 coupled to gates of the transistors via, for example, respective series resistors $R_{B1}$ and $R_{B2}$. As shown in FIG. 1A, a configurable switching arrangement (110) coupled between the series resistor $R_{B2}$ and a gate of the casode transistor M2 may further control an effective voltage at the gate of the cascode transistor M2 for operation of the amplifier (100) according to different modes of operation, including an active mode wherein the input RF signal, $RF_{IN}$, is amplified via a current that flows through the amplifier (100) (i.e., between the supply voltage $V_{DD}$ coupled to M2 and the reference ground, $V_{GND}$, couple to M1), and an inactive (e.g., standby, idle) mode, wherein no current flows through the amplifier (100), and therefore no amplification of the input RF signal, $RF_{IN}$, occurs.

As shown in FIG. 1A, during operation in the active mode, a series connected switch, SW21, of the configurable switching arrangement (110) may be closed to couple the biasing voltage, Vbias2, to the gate of the cascode transistor M2, while a shunting switch, SW22, of the configurable switching arrangement (110) may be open in order to not shunt (i.e., short to $V_{GND}$) the gate of the cascode transistor M2. Accordingly, during operation in the active mode, the switching arrangement (110) effectively controls a gate voltage, $V_{G\_M2}$, at the gate of the transistor M2 based on a voltage provided by the biasing voltage Vbias2. On the other hand, during operation in the inactive mode shown in FIG. 1B, the series connected switch, SW21, of the configurable switching arrangement (110) may be open to decouple the biasing voltage, Vbias2, from the gate of the cascode transistor M2, while the shunting switch, SW22, of the configurable switching arrangement (110) may be closed in order to shunt, or short to $V_{GND}$, the gate of the cascode transistor M2. Accordingly, during operation in the inactive mode, the switching arrangement (110) effectively controls the gate voltage, $V_{G\_M2}$, at the gate of the transistor M2 to be equal to the reference ground, $V_{GND}$, by shorting such gate to $V_{GND}$.

With further reference to the prior art configuration shown in FIG. 1A, during operation in the active mode, a shunting gate capacitor, $C_{B2}$, coupled to the gate of the cascode transistor M2 is configured to short the gate of M2 at frequencies of operation (e.g., frequencies of the RF signal) of the amplifier (100) in order to provide a common gate configuration of the cascode transistor M2. On the other hand, at the frequencies of operation of the amplifier (100), the source of input transistor M1 is coupled to the reference ground either directly (no optional inductor $L_G$) or through the optional inductor $L_G$, in order to provide a common source configuration of the input transistor. In general, the stacked cascode amplifiers described in the present disclosure include a common source input transistor and one or more common gate cascode transistors.

A person skilled in the art would understand that because the gate of the cascode transistor M2 is shorted (e.g., to GND) during operation in the inactive mode, the cascode transistor M2 is turned OFF and no current flows through such transistor. It follows that at a time immediately after a switching of modes of operation from the inactive mode (e.g., FIG. 1B) to the active mode (e.g., FIG. 1A), the cascode transistor M2 remains turned OFF and no current can flow through such transistor until the gate voltage $V_{G\_M2}$ of the transistor M2 reaches a level sufficiently high for conduction of the transistor M2. However, a time to reach such sufficiently high level for conduction of the transistor M2 may be a function of a charging time constant that is based on the capacitance (i.e., size, value) of the gate capacitor, $C_{B2}$. It should be noted that the input transistor M1 has its own startup time, and may have circuit enhancements to achieve a fast startup time, faster than a startup time of the cascode transistor M2. Accordingly, the present disclosure mainly focuses on the startup time of the cascode transistor M2. A corresponding delay between start of conduction (ON state) of the cascode transistor M2 with respect to the start of conduction of the input transistor M1 can result in an undesired additional latency amount before the amplifier (100) can operate according to an expected performance. In some cases, such additional latency can increase a turn ON time of the amplifier by up to one microsecond or more.

Because the capacitance of the gate capacitor $C_{B2}$ may be based on i) the frequency of operation of the RF signal for providing the common gate configuration of the transistor M2 and ii) a filtering effect to reduce noise from the biasing circuit that generates the biasing voltages (e.g., Vbias1, Vbias2) into the stack of transistors (M1, M2), increasing the capacitance of the gate capacitor $C_{B2}$ in order to reduce the associated charging time constant, and therefore reduce the turn ON time of the prior art amplifier (100), may not be possible. Teachings according to the present disclosure provide a solution to reduce, or accelerate, the turn ON time without compromising effectiveness of the gate capacitor $C_{B2}$.

SUMMARY

According to a first aspect of the present disclosure, a radio frequency (RF) amplifier circuit is presented, the RF amplifier circuit comprising: a transistor stack comprising a common source input transistor and one or more common gate cascode transistors comprising an output transistor, the transistor stack coupled between a supply voltage and a reference ground, a configurable switching arrangement coupled to a gate of a cascode transistor of the one or more common gate cascode transistors, the configurable switching arrangement comprising: i) a shunting switch configured to selectively couple the gate of said cascode transistor to the reference ground; ii) a pre-charge switch configured to selectively couple a first terminal of a gate capacitor to a pre-charge voltage; and iii) a series connected switch configured to selectively couple the first terminal of the gate capacitor to the gate of said cascode transistor, and a series connected resistor coupled, at a first terminal of said resistor, to the first terminal of the capacitor, and configured to be coupled, at a second terminal of said resistor, to a biasing voltage for said cascode transistor, wherein the RF amplifier circuit is configured to operate according to at least an active mode for amplification on an input RF signal provided to the input transistor via a final current that flows through the transistor stack, and an inactive mode wherein no current flows through the transistor stack, wherein during operation in at least a portion of the inactive mode, the shunting switch is closed, the pre-charge switch is closed, and the series connected switch is open, wherein during operation in at least a portion of the active mode, the shunting switch is open, the pre-charge switch is open, and the series connected switch is closed, and wherein the pre-charge voltage has a level that is higher than a level of the biasing voltage of said cascode transistor during operation in the active mode.

According to a second aspect of the present disclosure, a method for reducing a turn ON time of a cascode amplifier is presented, the method comprising: during at least a portion of an inactive mode of operation of the cascode amplifier, coupling a gate of a cascode transistor of the cascode amplifier to a reference ground via a first switch, thereby preventing a current flow through the cascode transistor; and during at least a portion of an active mode of operation of the cascode amplifier, coupling, via a second switch, the gate of the cascode transistor to a gate capacitor that is pre-charged, at a switching time between operation from the inactive mode to the active mode, to a pre-charge voltage level that is higher than a gate biasing voltage of said cascode transistor during operation in the active mode for providing a final current flow through the cascode amplifier.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1A shows a prior art configuration of a stacked cascode amplifier during an active mode of operation of the amplifier.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 1B:
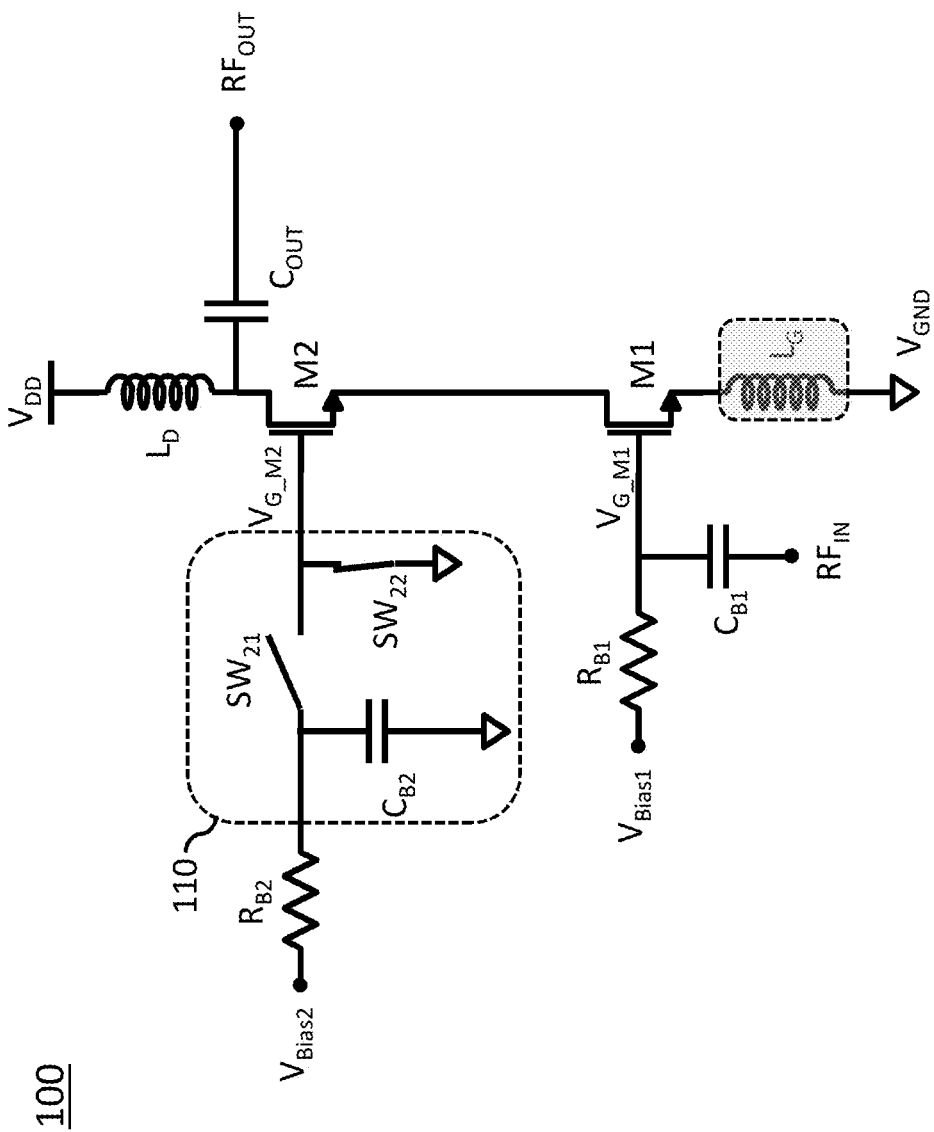
FIG. 1B shows a configuration of the prior art stacked cascode amplifier of FIG. 1A during an inactive mode of operation of the amplifier.

In the prior art configuration shown in FIGS. 1A-1B, since the cascode transistor M2 is not turned ON as quickly as the input transistor M1 after a mode switch from the inactive mode to the active mode, a current through the amplifier (100) may not be an expected current for a given biasing voltage to the input transistor, M1. This is because while the input transistor, M1, has reached its saturation region of operation to control a nominal (e.g., final) current through the amplifier (100) via an applied biasing voltage, Vbias1, the cascode transistor M2 may still be operating in its subthreshold region, and therefore not able to pass such nominal current through its drain to source conduction path. Such mismatch between the expected nominal current through the amplifier (100) and an effective current through the amplifier (100) that can be substantially smaller while the cascode transistor is not fully turned ON, may further exacerbate operation of the amplifier (100) in cases where the current through the amplifier is controlled via a feedback loop, as such feedback loop may, for example, further increase the biasing voltage Vbias1 to the gate of the input transistor M1 to compensate for the mismatch, and therefore further increase the turn ON time of the amplifier (100).

Teachings according to the present disclosure solve the above problem of the prior art amplifier (100) by pre-charging the gate capacitor $C_{B2}$ to a voltage that is sufficiently high that when coupled to the gate node of the cascode transistor, M2, after a mode switch from the inactive mode to the active mode, immediately provides operation of the cascode transistor M2 in its saturation region. Accordingly, immediately after the mode switch, the cascode transistor M2 can supply a current through its drain to source conduction path as requested by the biasing of the input transistor, M1. This will ensure that the input transistor M1 has enough drain-to-source voltage, $V_{DS}$, headroom in order to turn on as soon as it is own bias voltages are available. As the input transistor M1 may take some time to settle to its final operating points (i.e., operating biasing points), during such time the pre-charged gate capacitor $C_{B2}$ may discharge towards the biasing voltage Vbias2 for operation of the cascode transistor M2 according to its final operating points and in view of a current controlled/requested by the input transistor M1. It should be noted that the biasing voltage Vbias2 is inherently a higher voltage than the biasing voltage Vbias1 to ensure operation of the amplifier. Because the gate capacitor $C_{B2}$ can discharge faster to the level of the gate biasing voltage, Vbias2, than charge to such level from the fully discharged state provided by the prior art configuration of FIG. 1A, and because the cascode transistor M2 starts operation in its saturation region rather than its triode region per the prior art configuration of FIG. 1A, an accelerated turn ON time of the amplifier according to the present teachings can be obtained. In a case of a stack height higher than two (e.g., transistors M1 and M2 shown in FIGS. 1A and 1B), similar pre-charging of gate capacitors to any of the cascode transistors of the stacked cascode amplifier can be provided, including scaling of the voltages used for the pre-charging of the gate capacitors with respect to respective positions of the cascode transistors within the stack. It should be noted that the value (capacitance) of $C_{B2}$ is typically chosen to optimize RF performance, and as a result such value of $C_{B2}$ may be substantially larger than a gate-to-source capacitance, Cgs,of M2. Accordingly, a charge of $C_{B2}$ is shared with Cgs_of M2 when the switch (e.g., SW21) closes, but will start at a value close to $V_{DD2}$ since $C_{B2}$ is large. The bias will then settle to Vbias2 according to and RC time constant (e.g., provided by $C_{B2}$ and $R_{B2}$). This results in an initial Vg2 bias voltage overshoot, but this is far better than having the device (M2) in a subthreshold condition in the case where Vg2 starts at ground per the prior art configuration.

Figure 2A:
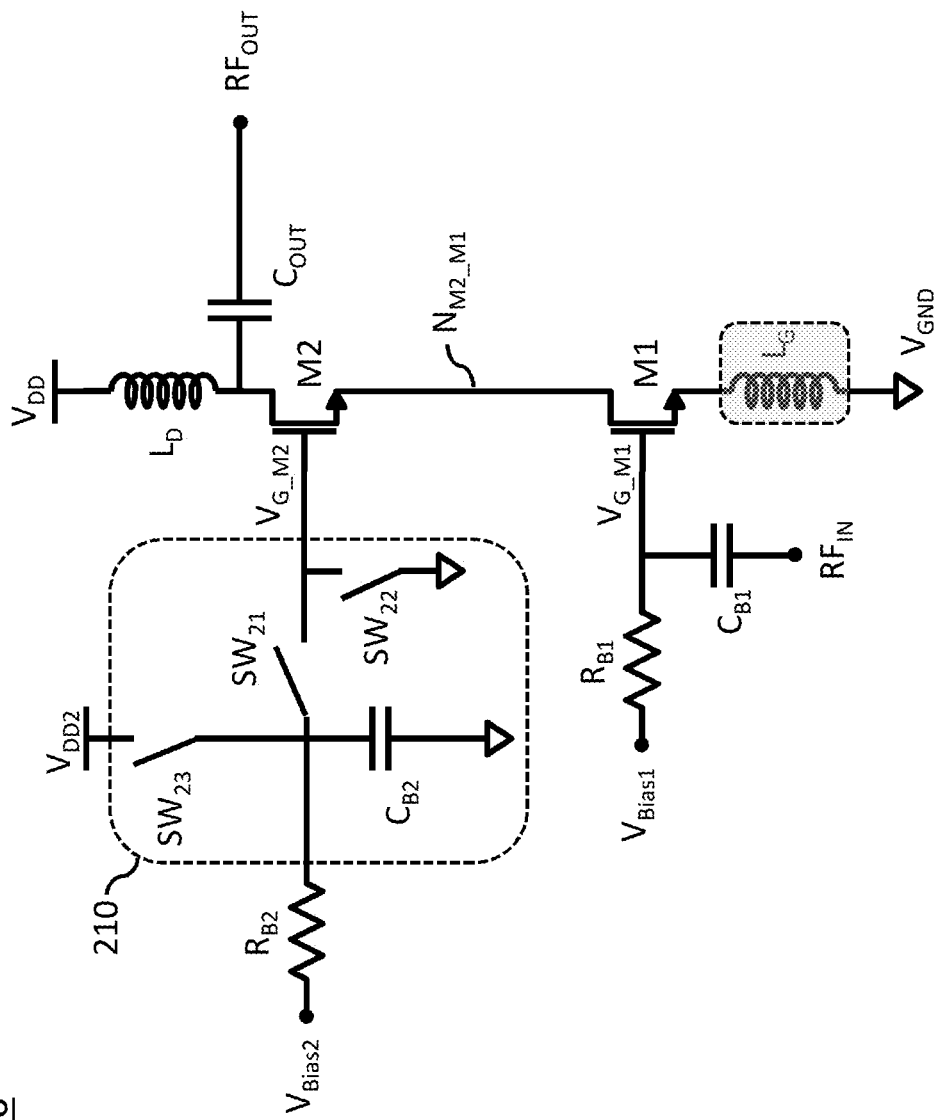
FIG. 2A shows a configuration of a stacked cascode amplifier according to an embodiment of the present disclosure.

FIG. 2A shows a configuration of a stacked cascode amplifier (200) according to an embodiment of the present disclosure. Such configuration is similar to one described with reference to FIG. 1A except for the structure of the configurable switching arrangement (210). According to an embodiment of the present disclosure, the configurable switching arrangement (210) pre-charges the gate capacitor $C_{B2}$ to a pre-charge voltage $V_{DD2}$ that is sufficiently high to operate the cascode transistor M2 in its saturation region immediately after a mode switch from the inactive mode to the active mode of the amplifier.

As shown in FIG. 2A, the configurable switching arrangement (210) includes i) a series connected switch, SW21, coupled between the gate node of the cascode transistor M2 and a terminal of the gate capacitor $C_{B2}$ that carries a voltage that is stored in said capacitor, ii) a shunting switch, SW22, coupled between the gate node of the cascode transistor M2 and the reference ground, $V_{GND}$, and iii) a pre-charge switch, SW23, coupled between a pre-charge voltage, $V_{DD2}$, and said terminal of the gate capacitor, $C_{B2}$. It should be noted that the switches SW21, SW22, and SW23 can be any type of switch known to a person skilled in the art, including electromechanical switches, MEMS switches, semiconductor switches, and transistor switches, so long they can provide sufficiently low off capacitances when open and sufficiently low on resistances when closed such as, for example, to not affect, or have a negligible effect on the, operation of the amplifier during the active mode of operation.

Figure 2B:
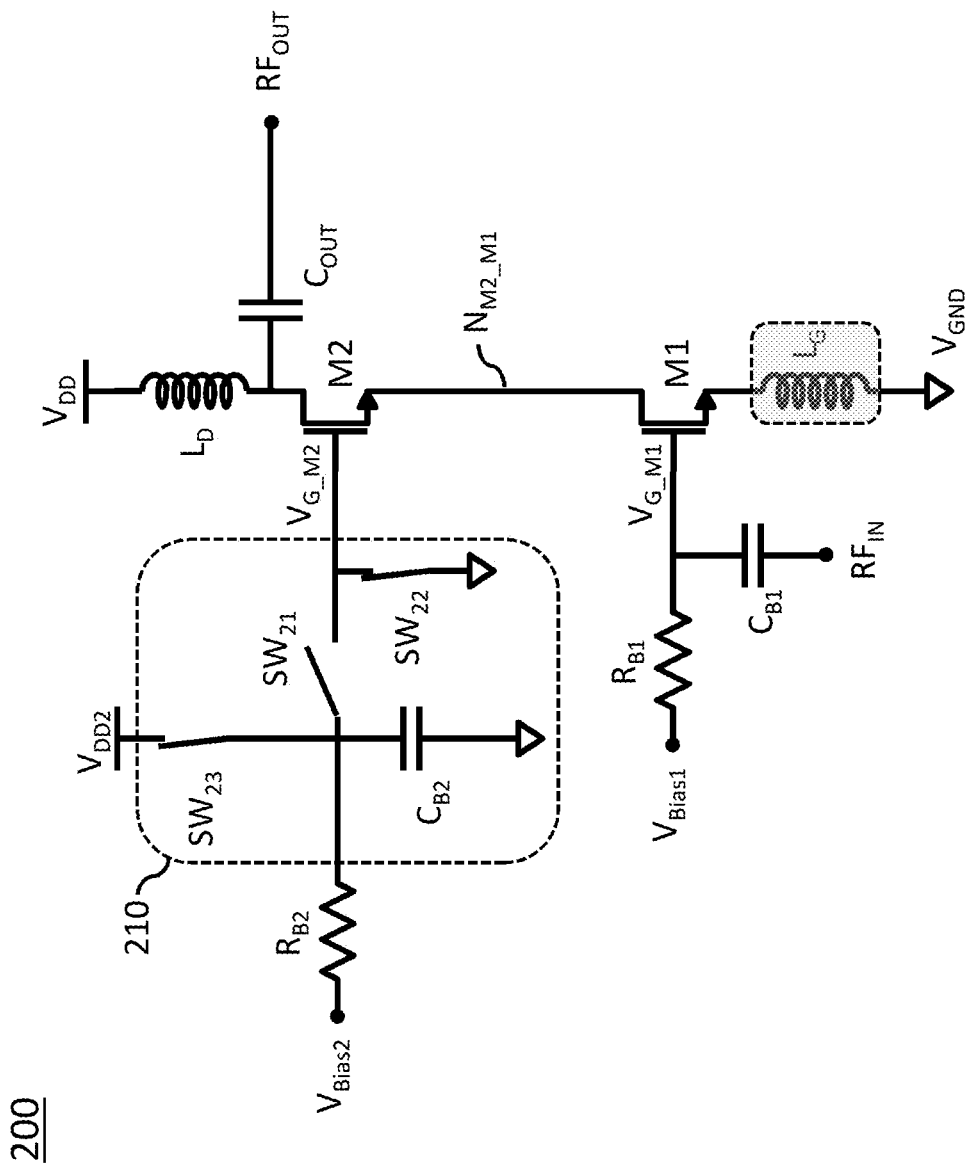
FIG. 2B shows a configuration of the stacked cascode amplifier of FIG. 2A during an inactive mode of operation of the amplifier.

According to an embodiment of the present disclosure shown in FIG. 2B, during the inactive mode of operation of the amplifier (200) (or a portion thereof), the series connected switch, SW21, is open and therefore decouples a voltage across the gate capacitor, $C_{B2}$, from the gate node of the cascode transistor M2, and the shunting switch, SW22, is closed and therefore shorts the gate node of the cascode transistor M2 to the reference ground, $V_{GND}$. On the other hand, the pre-charge switch, SW23, is closed and therefore the gate capacitor, $C_{B2}$, is pre-charged to a voltage level provided by the pre-charge voltage, $V_{DD2}$. Accordingly, during the inactive mode of operation (or portion thereof), the configurable switching arrangement (210): i) sets the gate voltage, $V_{G\_M2}$, of the cascode transistor, M2, to the reference ground, $V_{GND}$, level, ii) pre-charges the gate capacitor, $C_{B2}$, to the pre-charge voltage, $V_{DD2}$, and iii) decouples the terminal of the gate capacitor, $C_{B2}$, that carries the pre-charge voltage, $V_{DD2}$, from the gate node of the cascode transistor, M2. It should be noted that because the gate voltage, $V_{G\_M2}$, is set to zero volts, the cascode transistor, M2, is completely OFF as no current flows through the transistor. Furthermore, the biasing voltage, Vbias1, to the input transistor, M1, also renders the input transistor, M1, completely OFF during operation of the amplifier (200) in its inactive mode of operation. A person skilled in the art would know that a transistor is said to be OFF if a corresponding gate-to-source voltage, $V_{GS}$, is smaller than a threshold voltage, Vth, of the transistor. On the other hand, a transistor is said to be ON if the corresponding gate-to-source voltage, $V_{GS}$, is greater than the threshold voltage, Vth, in which case the transistor may operate in either its triode region (i.e., ohmic region) of operation for a lower on resistance and lower drain-to-source current, or its saturation region of operation for a higher on resistance and higher drain-to-source current for a given gate-to-source voltage, $V_{GS}$.

Figure 2C:
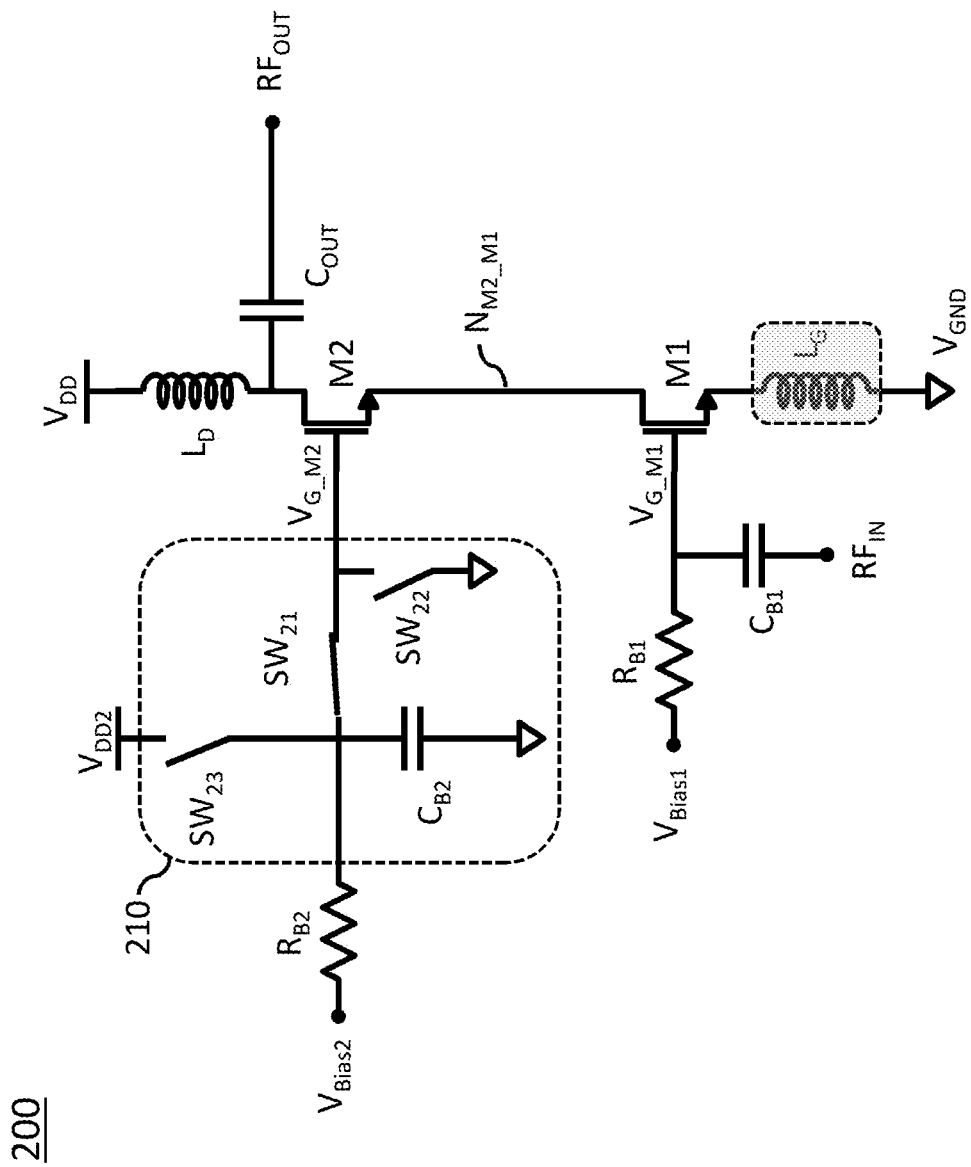
FIG. 2C shows a configuration of the stacked cascode amplifier of FIG. 2A during an active mode of operation of the amplifier.

According to an embodiment of the present disclosure shown in FIG. 2C, during the active mode of operation of the amplifier (200) (or portion thereof), the series connected switch, SW21, is closed and therefore couples a voltage across the gate capacitor, $C_{B2}$, to the gate node of the cascode transistor M2, and the shunting switch, SW22, is open and therefore decouples the gate node of the cascode transistor M2 form the reference ground, $V_{GND}$. On other hand, the pre-charge switch, SW23, is open and therefore the gate capacitor, $C_{B2}$, discharges from the pre-charge voltage level, $V_{DD2}$, to a voltage level provided by the biasing voltage, Vbias2. Accordingly, during the active mode of operation (or portion thereof), the configurable switching arrangement (210): i) sets the gate voltage, $V_{G\_M2}$, of the cascode transistor, M2, to a level provided across the gate capacitor, $C_{B2}$, ii) decouples the gate capacitor, $C_{B2}$, from the pre-charge voltage, $V_{DD2}$, and iii) decouples the gate node of the cascode transistor, M2, from the reference ground, $V_{GND}$. Therefore, immediately after a mode switch from the inactive mode to the active mode of the amplifier (200), the cascode transistor M2 is biased for operation in its saturation region and therefore a current through such transistor can support a demand current as set forth by the input transistor, M1, based on the biasing voltage, Vbias1, to the input transistor, M1. As the input transistor, M1, settles to its intended (i.e., final) operating points, the cascode transistor, M2, also settles to its intended operating points while the gate capacitor, $C_{B2}$, discharges to a voltage level of the biasing voltage, Vbias2. Accordingly, a turn ON time of the amplifier (200) after the mode switch is accelerated (reduced) when compared to the prior art configuration described above with reference to FIGS. 1A and 1B. As used herein, a turn ON time may be referred to an amount of time, starting immediately after the mode switch, that it takes for either of: a) the amplifier to operate within 0.5 dB of its (steady state, final) gain, or b) a current through the amplifier is within 10% of a final current.

According to an embodiment of the present disclosure, the pre-charge voltage, $V_{DD2}$, coupled to the gate capacitor, $C_{B2}$, during operation in the inactive mode of the amplifier (200) of FIG. 2A, is such that immediately after the mode switch from the inactive mode to the active mode, the cascode transistor M2 operates in its saturation region of operation. As described above, such operation of the cascode transistor M2 can ensure that a current demand by the input transistor, M1, is satisfied during a settling of the input transistor M1 to its final operating points. As such current demand may become substantial once the input transistor M1 has transitioned to its saturation region of operation, according to an exemplary embodiment of the present disclosure, the pre-charge voltage, $V_{DD2}$, is such that: $V_{DD2} > V_{DSAT\_M1} + V_{TH\_M2}$, wherein $V_{DSAT\_M1}$ represents a minimum drain-to-source voltage of the input transistor, M1, for which the input transistor operates in its saturation region, and $V_{TH\_M2}$, represents the threshold voltage of the cascode transistor, M2. Because $V_{DSAT\_M1}$ also represents the voltage at the common drain-source node, $N_{M2\_M1}$, of the series connection between the two transistors M1 and M2, by setting such value of the pre-charge voltage, $V_{DD2}$, it is guaranteed that when the input transistor, M1, reaches its saturation region of operation after the mode switch, the gate-to-source voltage, $V_{GS}$, of the cascode transistor, M2, is greater than its threshold voltage, $V_{TH\_M2}$. Accordingly, the cascode transistor M2 is ON and operates in its saturation region of operation. A person skilled in the art will clearly understand that SW21 must be open before SW22 and SW23 are closed.

Figure 3:
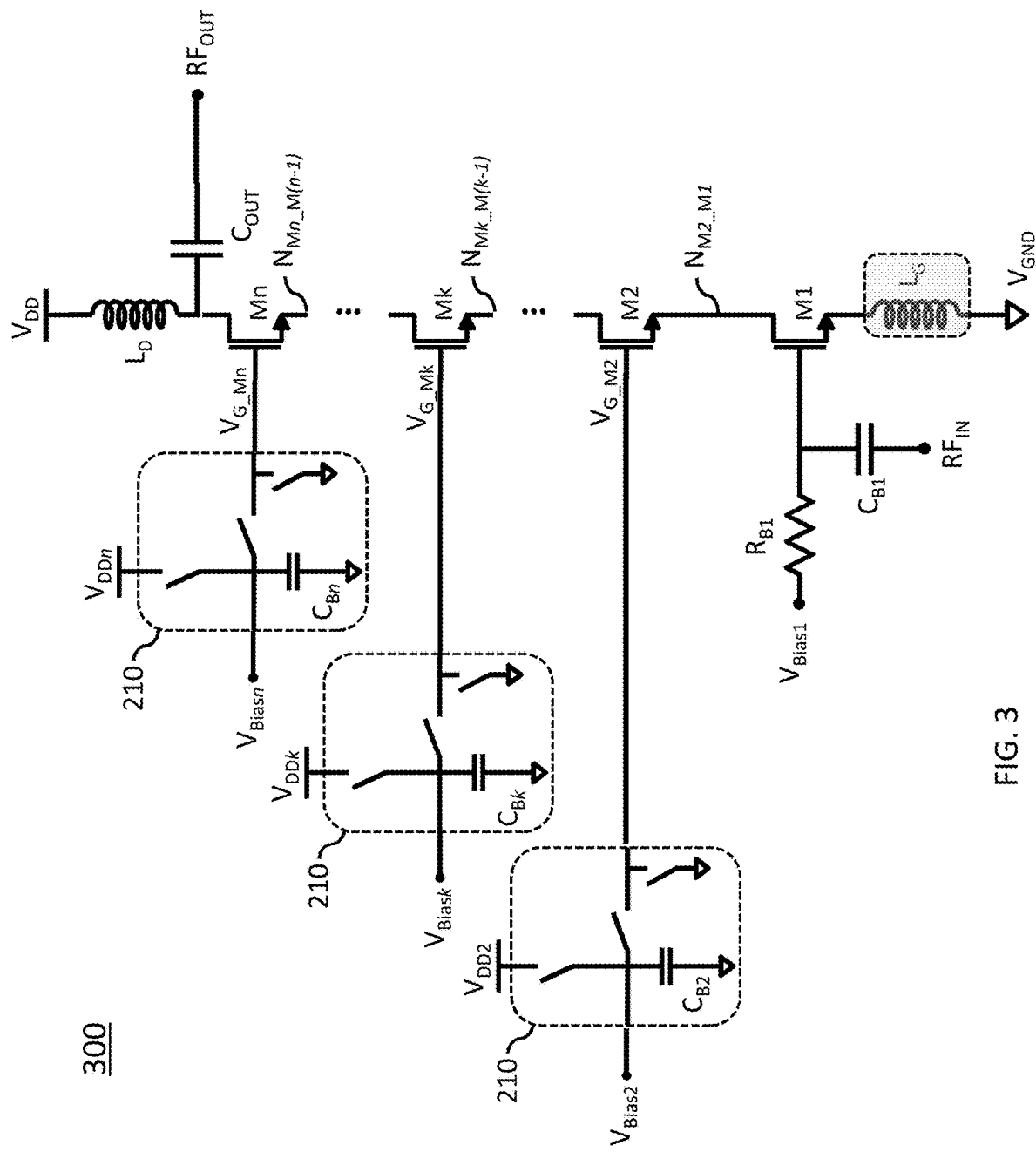
FIG. 3 shows a configuration of a stacked cascode amplifier according to an exemplary embodiment of the present disclosure for a stack height of n.

FIG. 3 shows a configuration of a stacked cascode amplifier (300) according to an exemplary embodiment of the present disclosure for a stack height of n, where n is an integer number equal to or larger than 2. As shown in FIG. 3, for each of the cascode transistors (M2, ..., Mn), a configurable switching arrangement (210) with structure and operation similar to one described above with reference to FIGS. 2A-2C can be provided. As described above, during the inactive mode of operation of the amplifier (300), each such arrangement (210) may pre-charge a gate capacitor ($C_{B2}$, ..., $C_{Bn}$) that is selectively coupled to a gate node of a respective cascode transistor (M2, ..., Mn) to a pre-charge voltage ($V_{DD2}$, ..., $V_{DDn}$) such that immediately after a mode switch of the amplifier (300) from the inactive mode to the active mode, each of the cascode transistors (M2, ..., Mn) can operate in their respective saturation regions of operation. Because each source node of the cascode transistors (M2, ..., Mn) sees a different voltage, the pre-charge voltages ($V_{DD2}$, ..., $V_{DDn}$) may be pre-scaled according to a position of a cascode transistor (M2, ..., Mn) within the stack of transistors (M1, ..., Mn).

With continued reference to FIG. 3, according to an exemplary embodiment of the present disclosure, the pre-charge voltage, $V_{DDk}$, for $2 \le k \le n$, is such that: $V_{DDk} > V_{DSAT\_M1} + V_{DSAT\_M2} + V_{DSAT\_m(k-1)} + V_{TH\_Mk}$, wherein $V_{DSAT\_Mp}$ represents a minimum drain-to-source voltage of a transistor of the stack (M1, M2, ..., Mn) for which the transistor operates in its saturation region, and $V_{TH\_Mk}$, represents the threshold voltage of the cascode transistor, Mk of the stack (M1, ..., Mn). Because $Vddk - V_{th\_Mk}$ also represents the voltage at the common drain-source node, $N_{Mk\_M(k-1)}$, of the series connection between the two transistors Mk and M(k-1), by setting such value of the pre-charge voltage, $V_{DDk}$, it is guaranteed that when the input transistor, M1, reaches its saturation region of operation after the mode switch, the gate-to-source voltage, $V_{GS}$, of any cascode transistor Mk of the cascode transistors (M2, ..., Mn) is greater than a respective threshold voltage, $V_{TH\_Mk}$. Accordingly, a current demand set forth by the input transistor M1 during a transition to the ON state of the amplifier (300) can be satisfied by the series connected cascode transistors (M2, ..., Mn) that operate in their respective saturation regions of operation. A person skilled in the art would clearly understand that the voltages $V_{DSAT\_Mk}$ and $V_{TH\_Mk}$ may be different from the voltage $V_{DSAT\_Mp}$ and $V_{TH\_Mp}$ if the transistors Mk and Mp have different characteristics, such as for example, different size, gate width and/or gate length. In case where transistors of same characteristics are used in the stack, then the above expression for the pre-charge voltage, $V_{DDK}$, can be simplified to: for $2 \le k \le n$, $V_{DDk} > (k-1)*V_{DSAT\_M} + V_{TH}$, wherein $V_{DSAT\_M}$ represents a minimum drain-to-source voltage of each transistor of the stack (M1, M2, ..., Mn) for which the transistor operates in its saturation region, and $V_{TH}$, represents the threshold voltage of each transistor of stack.

Figure 4:
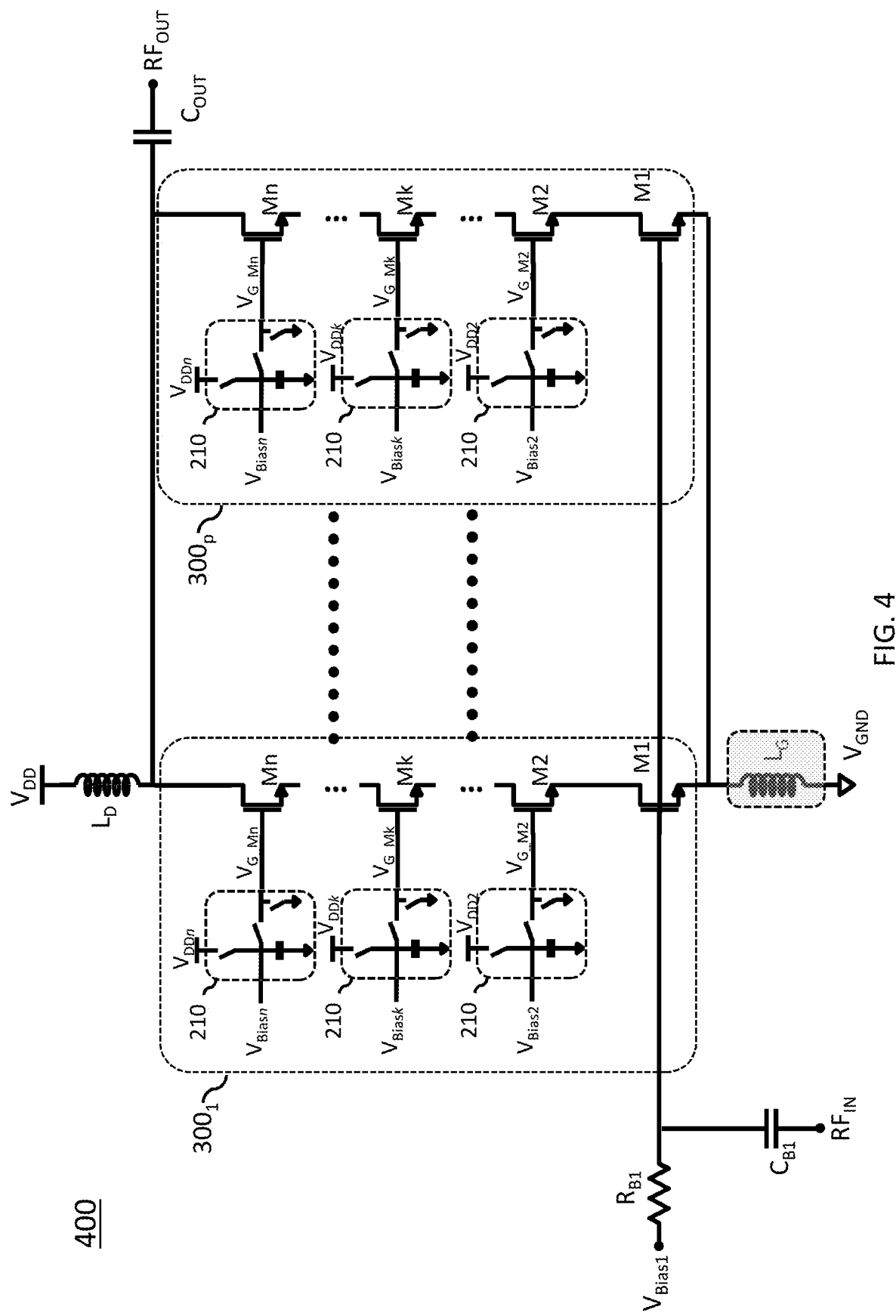
FIG. 4 shows a configuration of a multi-branch cascode amplifier wherein each branch is a stacked cascode amplifier according to the configuration of FIG. 3.

Teachings according to the present disclosure may be applied to amplifiers operating as power amplifiers (PAs) in transmitter sections of RF front-end communication systems, or as low noise amplifiers (LNAs) in receiver sections of RF front-end communication systems. According to some exemplary embodiments of the present disclosure, the amplifiers according to the present teachings may be part of a multi-branch cascode amplifier (400) as shown in FIG. 4. In such multi-branch configuration, shown in FIG. 4 as including a plurality p of branches, one or more of the amplifier branches (300) may be selectively turned ON or OFF according to, for example, a desired gain or effective final current, through the multi-branch cascode amplifier (400). Turn ON and turn OFF of the branches can be provided through the configurable switching arrangements (210) coupled to the cascode transistors (e.g., M1, ..., Mn) of the one or more branches. Such configuration according to the present disclosure shown in FIG. 4 allows acceleration of a turn ON time of a branch ($300_k$) of the plurality p of branches ($300_1$, ..., $300_p$) of the multi-branch cascode amplifier (400). A person skilled in the art is well aware of structures and principle of operation of a multi-branch cascode amplifier. More information on a multi-branch cascode amplifier can be found, for example, in the above referenced U.S. Pat. No. 9,929,701 B1. It should be noted that the cascode transistor M2 may not necessarily be pulled to ground in the inactive state as shown in the figures, but rather may be pulled to some different voltage, such as, for example, to protect the transistor M2 from overvoltage conditions in view of corresponding biasing voltages (e.g., level of $V_{DD}$).

Figure 5:
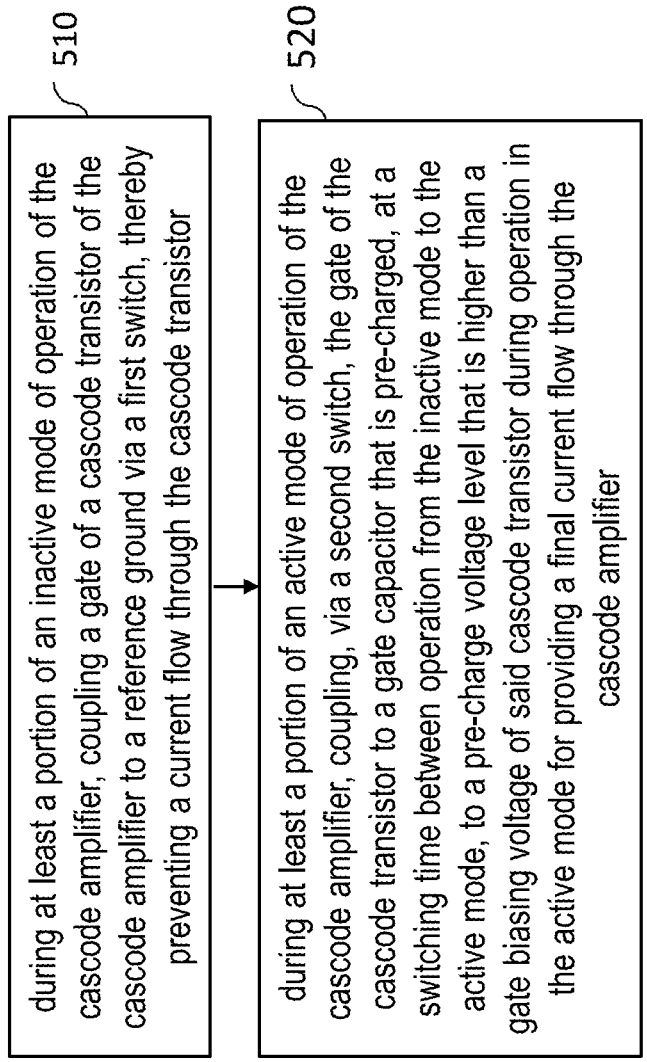
FIG. 5 is a process chart showing various steps of a method for reducing a turn ON time of a cascode amplifier.

FIG. 5 is a process chart (500) showing various steps of a method for reducing a turn ON time of a cascode amplifier. As can be seen in the process chart (500), the method comprises: during at least a portion of an inactive mode of operation of the cascode amplifier, coupling a gate of a cascode transistor of the cascode amplifier to a reference ground via a first switch, thereby preventing a current flow through the cascode transistor, per step (510), and during at least a portion of an active mode of operation of the cascode amplifier, coupling, via a second switch, the gate of the cascode transistor to a gate capacitor that is pre-charged, at a switching time between operation from the inactive mode to the active mode, to a pre-charge voltage level that is higher than a gate biasing voltage of said cascode transistor during operation in the active mode for providing a final current flow through the cascode amplifier, per step (520).

It should be noted that the various embodiments of the amplifier circuits according to the present disclosure may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the gate drivers for stacked transistor amplifiers of the disclosure, and are not intended to limit the scope of what the applicant considers to be the invention. Such embodiments may be, for example, used within mobile handsets for current communication systems (e.g. WCDMA, LTE, WiFi, etc.) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A radio frequency (RF) amplifier circuit comprising:
   a) a transistor stack comprising a common source input transistor and one or more common gate cascode transistors comprising an output transistor, the transistor stack coupled between a supply voltage and a reference ground,
   b) a configurable switching arrangement coupled to a gate of a cascode transistor of the one or more common gate cascode transistors, the configurable switching arrangement comprising:
      b1) a shunting switch configured to selectively couple the gate of said cascode transistor to the reference ground;
      b2) a pre-charge switch configured to selectively couple a first terminal of a gate capacitor to a pre-charge voltage; and
      b3) a series connected switch configured to selectively couple the first terminal of the gate capacitor to the gate of said cascode transistor, and
   c) a series connected resistor coupled, at a first terminal of said resistor, to the first terminal of the capacitor, and configured to be coupled, at a second terminal of said resistor, to a biasing voltage for said cascode transistor,
   wherein the RF amplifier circuit is configured to operate according to at least an active mode for amplification on an input RF signal provided to the input transistor via a final current that flows through the transistor stack, and an inactive mode wherein no current flows through the transistor stack,
   wherein during operation in at least a portion of the inactive mode, the shunting switch is closed, the pre-charge switch is closed, and the series connected switch is open,
   wherein during operation in at least a portion of the active mode, the shunting switch is open, the pre-charge switch is open, and the series connected switch is closed, and
   wherein the pre-charge voltage has a level that is higher than a level of the biasing voltage of said cascode transistor during operation in the active mode.

2. The RF amplifier circuit of claim 1,
   wherein during operation in said portion of the inactive mode, the configurable switching arrangement couples the gate of said cascode transistor to the reference ground, and
   wherein during operation in said portion of the active mode, the configurable switching arrangement couples the gate of said cascode transistor to the gate capacitor that is pre-charged at the pre-charge voltage.

3. The RF amplifier circuit of claim 1,
   wherein the one or more common gate cascode transistors consist of the output transistor, and
   wherein the pre-charge voltage is larger than a sum of:
      i) a threshold voltage of the output transistor, and
      ii) a minimum voltage value of a drain-to-source voltage of the input transistor for which the input transistor operates in its saturation region.

4. The RF amplifier circuit of claim 1,
   wherein the one or more common gate cascode transistors consist of a plurality n of series connected transistors arranged according to a sequence from a first cascode transistor coupled to the input transistor to an n-th cascode transistor being the output transistor, and
   wherein for said cascode transistor being a k-th cascode transistor of the sequence, the pre-charge voltage is larger than a sum of:
      a) a threshold voltage of the k-th cascode transistor,
      b) a sum of (k−1) voltages, each of the (k−1) voltages being a minimum voltage value of a drain-to-source voltage of a respective cascode transistor of the sequence arranged between the input transistor and the k-th cascode transistor, and
      c) a minimum voltage value of a drain-to-source voltage of the input transistor for which the input transistor operates in its saturation region.

5. The RF amplifier circuit of claim 4,
   wherein the RF amplifier circuit comprises additional (n−1) configurable switching arrangements, and
   wherein each configurable switching arrangement is coupled to a respective k-th cascode transistor of the plurality n of series connected transistors, k spanning from a value of 1 to a value of n.

6. The RF amplifier circuit of claim 1, wherein:
   each of the shunting switch, the pre-charge switch and the series connected switch is one of: a) an electromechanical switch, b) a MEMS switch, and c) a transistor switch.

7. The RF amplifier of claim 1, wherein the common source input transistor and the one or more common gate cascode transistors comprise metal-oxide-semiconductor (MOS) field effect transistors (FETs).

8. The RF amplifier of claim 7, wherein said transistors are fabricated using one of: a) silicon-on-insulator (SOI) technology, b) silicon-on-sapphire (SOS) technology, and c) bulk silicon (Si) technology.

9. The RF amplifier of claim 1, wherein the RF amplifier is monolithically integrated.

10. A multi-branch cascode amplifier comprising a plurality of amplifying branches, each amplifying branch comprising the RF amplifier of claim 1,
    wherein a drain of the output transistor of each of the amplifying branches is coupled to a common output node of the multi-branch cascode amplifier.

11. An electronic module comprising the RF amplifier of claim 1.

12. A radio frequency (RF) front-end communication system, comprising:
    a receiver section for receiving an RF signal according to different modes of operation, the receiver section comprising the RF amplifier of claim 1 operating as a low noise amplifier (LNA).

13. A method for reducing a turn ON time of a cascode amplifier, the method comprising:
    during at least a portion of an inactive mode of operation of the cascode amplifier, coupling a gate of a cascode transistor of the cascode amplifier to a reference ground via a first switch, thereby preventing a current flow through the cascode transistor; and
    during at least a portion of an active mode of operation of the cascode amplifier, coupling, via a second switch, the gate of the cascode transistor to a gate capacitor that is pre-charged, at a switching time between operation from the inactive mode to the active mode, to a pre-charge voltage level that is higher than a gate biasing voltage of said cascode transistor during operation in the active mode for providing a final current flow through the cascode amplifier.

14. The method according to claim 13,
    wherein said cascode transistor is one of one or more common gate cascode transistors of the cascode amplifier comprising an output transistor.

15. The method according to claim 14,
wherein the one or more common gate cascode transistors consist of the output transistor, and
wherein the pre-charge voltage is larger than a sum of:
  i) a threshold voltage of the output transistor, and
  ii) a minimum voltage value of a drain-to-source voltage of the input transistor for which the input transistor operates in its saturation region.

16. The method according to claim 14,
wherein the one or more common gate cascode transistors consist of a plurality n of series connected transistors arranged according to a sequence from a first cascode transistor coupled to an input transistor of the cascode amplifier, to an n-th cascode transistor being the output transistor, and
wherein for said cascode transistor being a k-th cascode transistor of the sequence, the pre-charge voltage is larger than a sum of:
  a) a threshold voltage of the k-th cascode transistor,
  b) a sum of (k−1) voltages, each of the (k−1) voltages being a minimum voltage value of a drain-to-source voltage of a respective cascode transistor of the sequence arranged between the input transistor and the k-th cascode transistor, and
  c) a minimum voltage value of a drain-to-source voltage of the input transistor for which the input transistor operates in its saturation region.

17. The method according to claim 13,
wherein the coupling of the gate of said cascode transistor during said portion of the inactive mode and said portion of the active mode is provided via a configurable switching arrangement that is coupled to the gate of said cascode transistor, the configurable switching arrangement comprising:
i) the first switch configured to selectively couple the gate of said cascode transistor to the reference ground;
ii) a pre-charge switch configured to selectively couple a first terminal of a gate capacitor to a pre-charge voltage; and
iii) the second switch configured to selectively couple the first terminal of the gate capacitor to the gate of said cascode transistor.

\* \* \* \* \*